(12) United States Patent
Watanabe et al.

(10) Patent No.: US 6,724,064 B2
(45) Date of Patent: Apr. 20, 2004

(54) PHOTOELECTRIC CONVERSION ELEMENT AND PHOTOELECTRIC CONVERSION DEVICE

(75) Inventors: Hiroyuki Watanabe, Nakai-machi (JP); Kazunori Anazawa, Nakai-machi (JP); Chikara Manabe, Nakai-nachi (JP); Masaaki Shimizu, Nakai-machi (JP)

(73) Assignee: Fuji-Xerox Co., Ltd., Tokyo (JP)

( * ) Notice: Subject to any disclaimer, the term of this patent is extended or adjusted under 35 U.S.C. 154(b) by 0 days.

(21) Appl. No.: 10/368,732

(22) Filed: Feb. 19, 2003

(65) Prior Publication Data
US 2003/0189235 A1 Oct. 9, 2003

(30) Foreign Application Priority Data

Apr. 9, 2002 (JP) ........................... 2002-106809

(51) Int. Cl.[7] ............................... H01L 31/00
(52) U.S. Cl. ............ 257/459; 257/443; 257/446; 257/448
(58) Field of Search ................ 257/443, 446, 257/448, 459

(56) References Cited

U.S. PATENT DOCUMENTS

2002/0172820 A1 * 11/2002 Majumdar et al. .......... 428/357
2003/0098488 A1 * 5/2003 O'Keeffe et al. .......... 257/401

OTHER PUBLICATIONS

Collins, Philip G., Arnold, Michael S., and Avouris, Phaedon: Engineering Carbon Nanotubes and Nanotube Circuits Using Electrical Breakdown, Science, vol. 292 (Apr. 27, 2001).

* cited by examiner

Primary Examiner—Ngân V. Ngô
(74) Attorney, Agent, or Firm—Pepe & Hazard LLP

(57) ABSTRACT

A photoelectric conversion element comprising a substrate and a light sensor disposed on a surface of the substrate and receiving high speed optical pulse signals and converting them into high frequency waves in which the light sensor comprises at least carbon nano-tubes, as well as a photoelectric conversion device having the element, for directly converting high speed optical pulses signals in a communication band into signals of high frequency waves or electromagnetic waves.

20 Claims, 12 Drawing Sheets

PHOTOELECTRIC CONVERSION ELEMENT AND PHOTOELECTRIC CONVERSION DEVICE

BACKGROUND OF THE INVENTION

1. Field of the Invention

This invention relates to a photoelectric conversion element and a photoelectric conversion device for converting high speed optical pulses into high frequency waves or electromagnetic waves in optical signal processing, optical communication, high frequency wave signal processing or high frequency wave signal communication.

2. Description of the Related Art

In the field of communication, basic trunk communication networks, as well as communication networks to each user have tended to be replaced with optical communication in recent years. However, in the communication terminals represented by portable remote terminals and portable telephones, high frequency wave communication will remain important in the future, and the entire communication networks have to be in the form where optical communication networks and high frequency wave communication network are present together.

At present, in the optical communication and the high frequency wave communication, signals used therein are once converted into electric signals and amplified or switched. High speed optical modulators or laser optical modulation technique are also present. Further, there is also adapted a technique of applying a high speed pulse light at femtosecond order to semiconductors or oxide superconductors thereby generating electromagnetic waves at a wavelength of about THz.

Generation of THz electromagnetic waves by the semiconductors or oxide superconductors is promising in a high speed region of 100 GHz or higher. According to the report by Sakai, et al., GaAs thin film optical switches grown at a low temperature are promising optical switches having a carrier life of 1 ps or less.

Generally, when a bias voltage is applied in most of semiconductors, the energy band near the surface is in a bent state, which forms a depletion layer to cause surface electric fields. When laser pulses at the femtosecond order are applied to the surface of the semiconductor forming the surface electric fields, electrons and holes induced by the laser beam are accelerated by the electric fields on the surface of the semiconductor, by which a surge current flows to generate THz electromagnetic waves by dipole radiation. The electric field component of the electromagnetic waves is in proportion with the time differential of the surge current and in proportion with the quadratic time differential of the polarization ratio on the surface of the semiconductor. In InP or GaAs having a wide band gap, the induced surface electric fields are large and, further, THz pulse waves by optical rectification of incident optical pulses by quadratic non-linear optical effect near the surface are also radiated simultaneously.

On the other hand, in InSb or InAs having a narrow band gap, induced surface electric fields are not large in which a surface current flows due to the difference of the diffusion rate between electrons and holes formed upon excitation of the surface by optical pulses referred to as a photo-dember effect, which causes THz pulse waves and radiation of THz pulse waves due to optical rectification effect also occurs.

However, in optical modulators or laser optical modulation technique, the upper limit for the speed is about several tens of GHz and high speed response in a several hundreds of GHz band or several THz cannot be obtained. Further, in the semiconductor optical switches, only the optical purpose with the incident wavelength of about 800 nm can be used and they are not applicable for a light at the wavelength of about 1.5 $\mu$m, which is an actual communication band.

SUMMARY OF THE INVENTION

Accordingly, this invention intends to provide a photoelectric conversion element and a photoelectric conversion device of directly converting high speed optical pulse signals in a communication band into signals of high frequency waves or electromagnetic waves.

The foregoing can be attained in accordance with this invention. That is, a photoelectric conversion element according to this invention includes a substrate and a light sensor disposed on a surface of the substrate to receive high speed optical pulse signals and convert them into high frequency waves, in which the light sensor includes at least carbon nano-tubes.

According to the photoelectric conversion element of this invention, when optical signals including optical pulses at a wavelength, for example, of equal to or larger than 1 $\mu$m and equal to or smaller than 2 $\mu$m or less are applied to the carbon nano-tubes, they are converted into high frequency waves or electromagnetic waves and radiated. Further, according to the photoelectric conversion element of this invention, high speed response is possible to, high frequency wave optical signals at 1 MHz or higher, as well as 10 THz.

More specifically, when a pair of electrodes is connected to both ends or the periphery thereof of the carbon nano-tube, respectively, high frequency waves or electromagnetic waves are formed between the electrodes. On the other hand, in a case where the electrodes are not connected or the electrodes are not incorporated in an electric circuit, the high frequency waves or electromagnetic waves converted from the high speed optical pulse signals are further radiated into air. Although the principle is not apparent, it is estimated that when InAs having a narrow band gap and of high mobility are formed into fine particles, the response speed to the light is improved and electromagnetic waves in accordance with the high speed optical pulses are radiated. It is further estimated that electro-optical conversion of high speed pulse signals can be attained by the efficient absorption of the electromagnetic waves to the carbon nano-tubes.

BRIEF DESCRIPION OF THE DRAWINGS

Preferred embodiments of this invention will be described in detail based on the foregoings, wherein.

Figure 11:
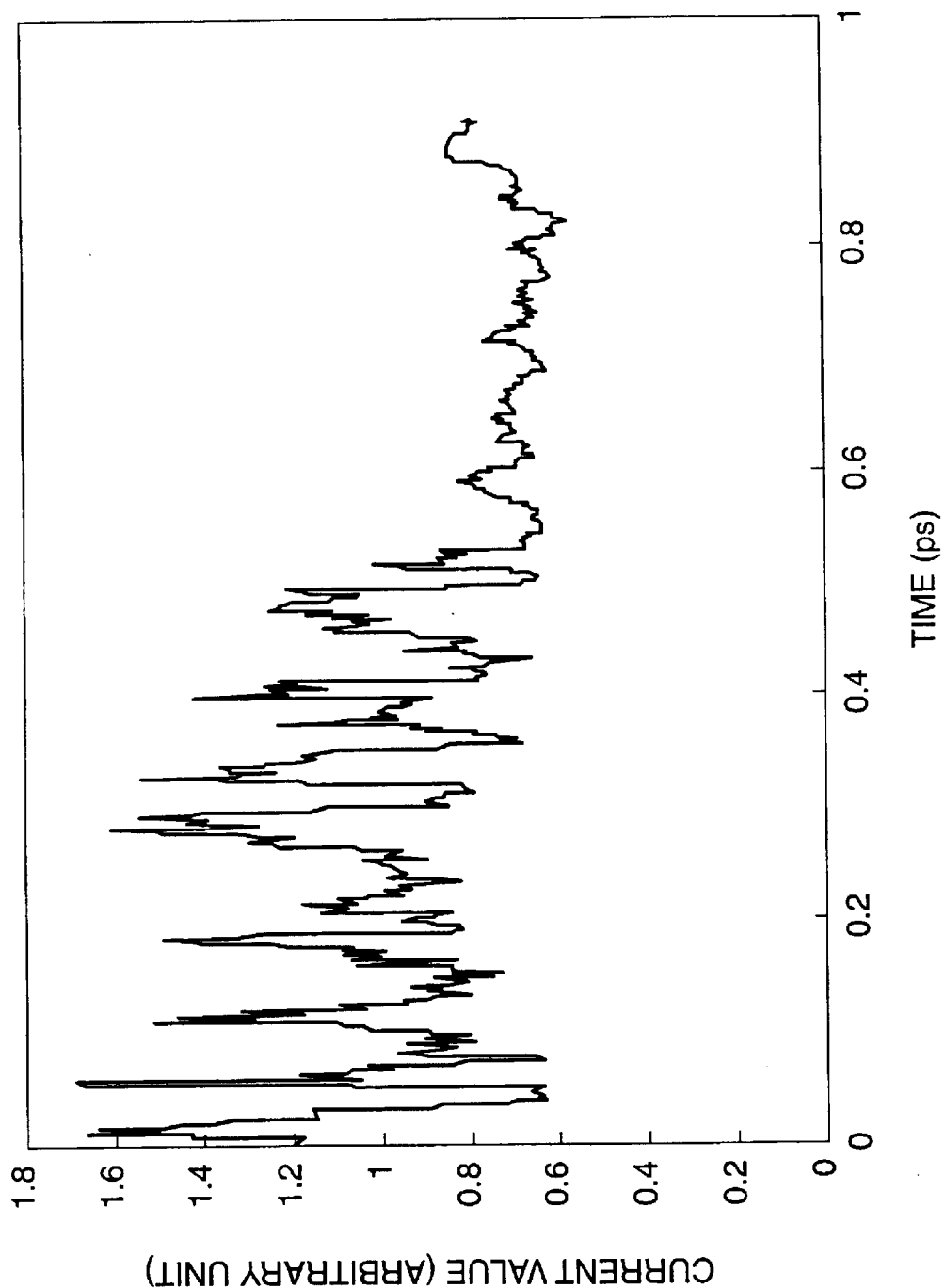
Figure 12:
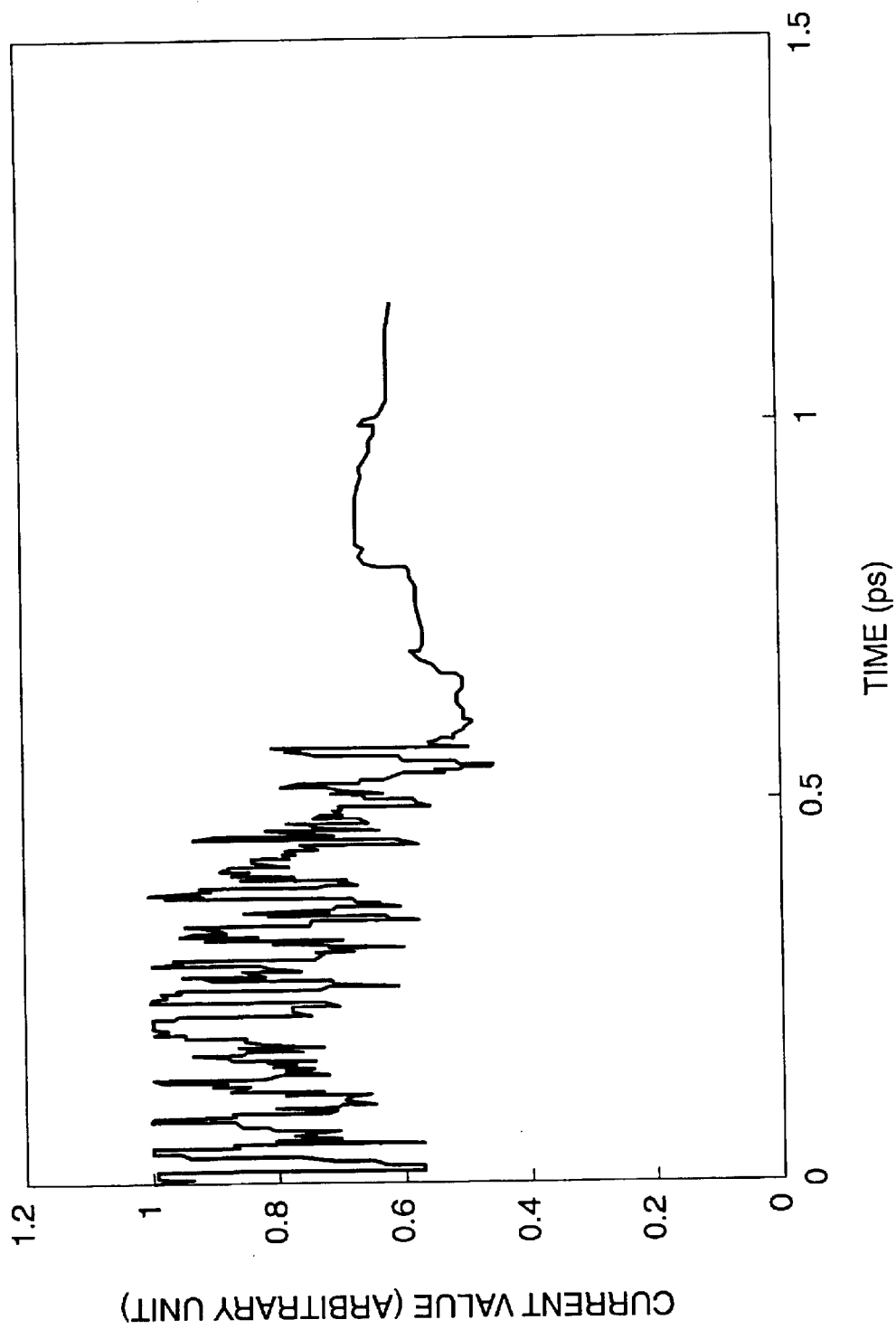

FIG. 11 is a graph showing the result of measurement for photoelectric conversion characteristics for the photoelectric conversion element in Comparative Example 1 in which the abscissa represents the time and the ordinate represents the current value (arbitrary unit) measured by the measuring system, respectively; and FIG. 12 is a graph showing the result of measurement for photoelectric conversion characteristics for the photoelectric conversion element in Example 3 in which the abscissa represents the time and the ordinate represents the current value (arbitrary unit) measured by the measuring system, respectively.

PREFERRED EMBODIMENTS OF THE INVENTION

This invention is to be described in detail with reference to preferred embodiments.
<Outline of the Invention>

Figure 1:
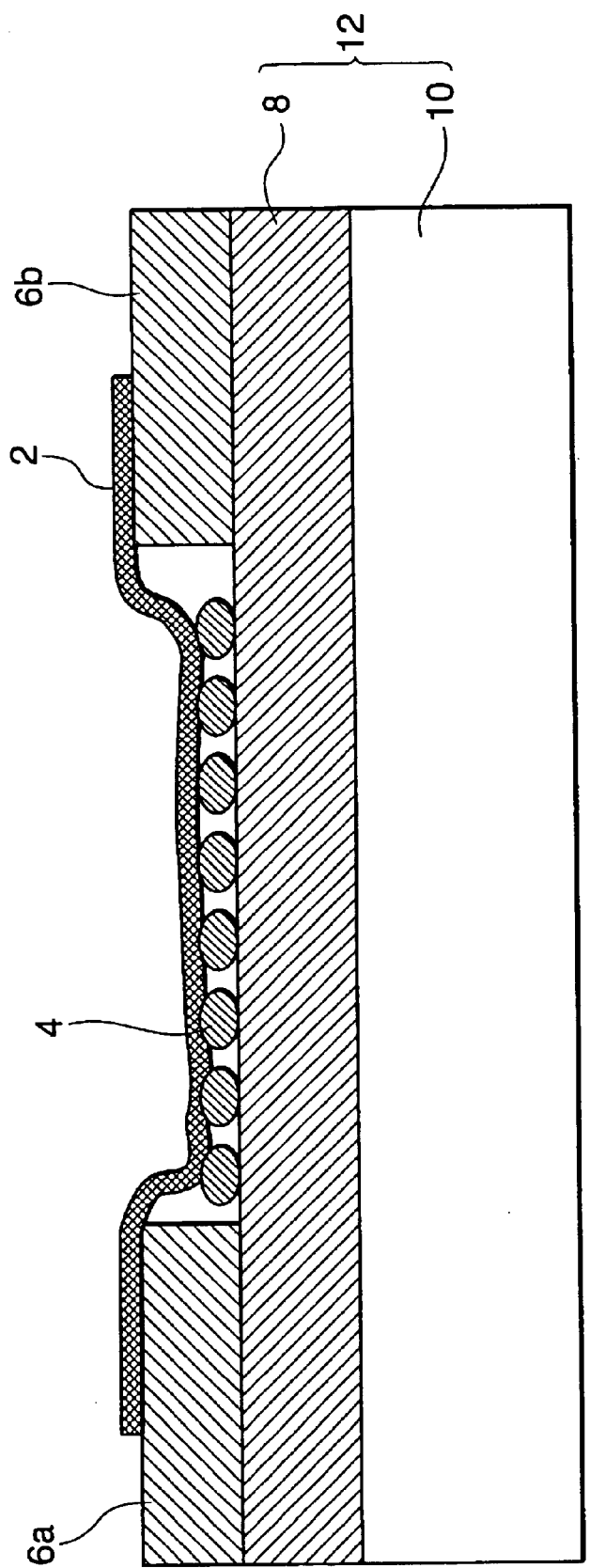
FIG. 1 is a schematic cross sectional view showing an example of a photoelectric conversion element according to this invention.
Figure 2:
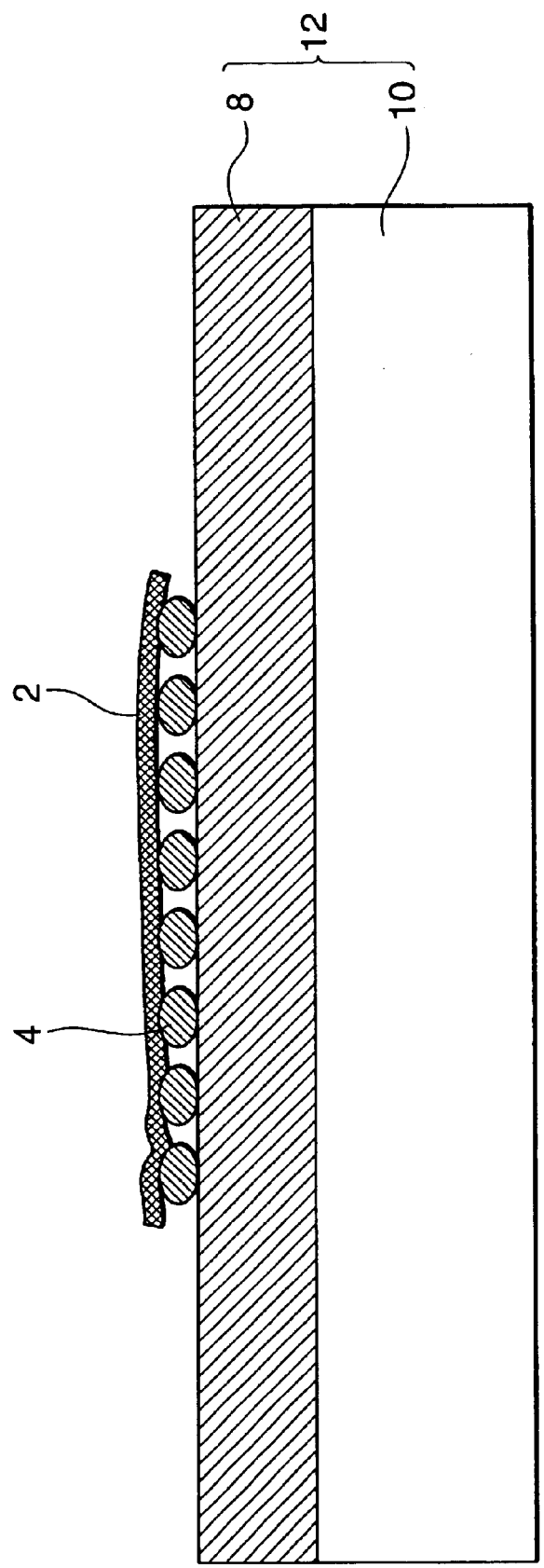
FIG. 2 is a schematic cross sectional view showing another example of a photoelectric conversion element according to this invention.

FIG. 1 and FIG. 2 show examples of using only one carbon nano-tube in the embodiment of the photoelectric conversion element according to this invention illustrated in a schematic cross sectional view. A photoelectric conversion element shown in FIG. 1 is used for converting high speed optical pulses into high frequency waves. On the other hand, the photoelectric conversion element shown in FIG. 2 is used for converting high speed optical pulses into high frequency waves.

In FIG. 1, numeral 2 denotes a carbon nano-tube, which is disposed in a state being bridged over a pair of electrodes 6a and 6b on the surface of a substrate 12 in which a dispersion elimination layer 8 is formed on a support plate 10 on the side where the dispersion layer 8 is formed. Numeral 4 denotes fine semiconductor particles, which are disposed to the surface of the substrate 12 on the side formed with the dispersion elimination layer 8, between a pair of the electrodes 6a and 6b in a state in electrical contact with the carbon nano-tube 2.

On the other hand, the photoelectric conversion element shown in FIG. 2 has a constitution of removing the pair of electrodes 6a and 6b from the photoelectric conversion element shown in FIG. 1, in which the carbon nano-tube 2 and fine semiconductor particles 4 in electrical contact with each other are disposed on the surface of the dispersion elimination layer 8 formed on the support plate 10.

The carbon nano-tube 2 is formed with an aim of shielding from external air and/or with an aim of providing physical protection. In a preferred embodiment, it is covered with a protective layer.

Constituent factors of the invention are to be described in details.
<Carbon Nano-Tube>

Generally, the carbon nano-tube means a graphen sheet of carbon in a hexagonal network which is formed into a tube parallel with the axis of the tube. The carbon nano-tube is further classified. A structure of a single graphen sheet is referred to as a single layered carbon nano-tube (single wall carbon nano-tube), while a structure including multi-layered of graphen sheet is referred to as a multi-layered carbon nano-tube (multi-wall carbon nano-tube). The structure of a carbon nanotube to be obtained is determined to some extent depending on the method and the condition for synthesis.

The carbon nano-tube as a principal constituent factor in this invention may be a single wall carbon nano-tube or two- or more-layered multi-wall carbon nano-tube, with the multi-wall carbon nano-tube being preferred. When a photo-receiving portion includes the multi-wall carbon nano-tube, handling is facilitated and the production efficiency is improved, as well as conversion efficiency of the high speed optical path signals is improved since each of the layers functions as a parallel electric transmission channel, to improve the photoelectric conversion efficiency.

Further, those not in the form of a tubular shape in a strict sense can also be used as the carbon nano-tube in the invention and they include, for example, a carbon nano-horn as a variation of a single wall carbon nano-tube (horn shape with diameter enlarged continuously from one to the other end), a carbon nano-coil (coiled shape having a spiral shape as a whole), a carbon nano-beads (a shape having a tube at the center which penetrates a spherical bead including amorphous carbon or the like), a cup stack nano-tube, and a carbon nano-tube covered at the outer circumference with carbon nano-horn or amorphous carbon.

Further, those carbon nona-tubes incorporating any substance in the carbon nano-tube can also be used as the carbon nano-tube in this invention and they include, for example, a metal-incorporated nano-tube in which a metal or the like is incorporated in a carbon nano-tube, and a pea pod nano-tube in which a fullerene or a metal-incorporated fullerene is incorporated in a carbon nano-tube.

As has been described above in this invention, common carbon nano-tube, as well as carbon nano-tubes in any shape such as variations thereof, carbon nano-tubes applied with various modifications and like other can be used with no troubles in view of the electric characteristic and high frequency characteristic. Accordingly, "carbon nano-tube" in this invention can include all of them within the concept thereof.

The carbon nano-tubes described above can be synthesized by any of the methods known so far such as an arc discharging method, a laser abrasion method and a CVD method with no particular restriction in the invention. Among them, the arc discharging method in magnetic fields is preferred with a viewpoint that carbon nano-tubes at high purity can be synthesized.

The carbon nano-tube used preferably has a diameter of equal to or larger that 0.3 nm and equal to or smaller than 100 nm. When the diameter of the carbon nanotube exceeds the range described above, the synthesis is difficult and it is not preferred in view of the cost. A more preferred upper limit for the diameter of the carbon nano-tube is 30 nm or less.

On the other hand, the lower limit for the diameter of the carbon nano-tube is about 0.3 nm in view of the structure thereof. Since an excessively small diameter may not sometimes be preferred because the yield upon synthesis is lowered, it is more preferably 1 nm or more and further preferably 3 nm or more.

The length of the carbon nano-tube used is preferably equal to or larger than 0.1 $\mu$m and equal to or smaller than 100 $\mu$m. When the length of the carbon nanotube exceeds the range, the synthesis is difficult or a special method is required for synthesis, which is not preferred in view of the cost. If the length is less than the range, connection with the electrodes is difficult in a case of providing a pair of electrodes as in the constitution shown in FIG. 1, which is not preferred. The upper limit for the length of the carbon nano-tube is more preferably 10 $\mu$m or less, while the lower limit thereof is more preferably 1 $\mu$m or more.

In each of examples in FIG. 1 and FIG. 2, the number of carbon nano-tubes connected with the electrodes is illustrated as one. The photoelectric conversion effect can be provided of course by the single carbon nano-tube, plural nano-tubes may also be used. It is preferred that the number of tubes is greater in order to improve the photoelectric conversion efficiency.

<Fine Semiconductor Particles>

In order to improve the photoelectric conversion efficiency further, it is preferred to dispose the fine semiconductor particles as a light sensor in electrical contact with the carbon nano-tube. When the fine semiconductor particles are disposed, high speed optical pulses can be converted directly and at a high efficiency into high frequency waves or electromagnetic waves.

There is no particular restriction on the fine semiconductor particles and it is preferred to include any one of fine semiconductor particles selected from the group of InAs, GaAs, InP, InSb, GaN, InN and GaInN, with fine semiconductor particles of InAs or InSb being particularly preferred.

The diameter of the fine semiconductor particles (in a case of a not spherical shape, a diameter equivalent to that of the sphere) is preferably within a range from 0.1 nm to 100 nm and, more preferably, from 2 nm to 10 nm.

The fine semiconductor particles and the carbon nano-tube function as the light sensor in a state in electrical contact with each other. The electrical contact state means a state where are in physical contact, as well as a state where they are close to each other to such an extent as allowing electrical conduction although they are spaced apart physically.

The fine semiconductor particles are preferably disposed at the position on the surface of the substrate in a case where a pair of electrodes are present (when the dispersion elimination layer 8 is formed on the support plate 10 as shown in FIG. 1 and FIG. 2, they are disposed as a further upper layer thereof. This corresponds to "surface of substrate" referred to in this invention) and between the pair of the electrodes (6a, 6b). As the positional relation between the fine semiconductor particles and the carbon nano-tube, either of them may be situated above and the other of them may be situated below, or both of them may be situated on the surface of the substrate. That is, in the embodiments of FIG. 1 and FIG. 2, the fine semiconductor particles 4 are disposed on the surface of the support plate 10 (further, on the dispersion elimination layer 8), on which the carbon nano-tube is situated but they are not restricted only to such a relation.

The amount of the fine semiconductor particles to be disposed is preferably within a range of 0.1 nm or more and 1 $\mu$m or less and, more preferably, 1 nm or more and 10 nm or less as the thickness of the layer including the fine semiconductor particles (fine particle layer).

<Electrode>

In the photoelectric conversion element according to this invention, for converting the high speed optical pulse signals received by the carbon nano-tube as the light sensor into high frequency waves, a pair of electrodes connecting with both ends or the periphery of the carbon nano-tube are necessary as in the constitution shown in FIG. 1. The converted high frequency waves can be taken out to the external circuit by use of the electrodes as the terminals. In a case where the high speed optical pulse signals are converted into electromagnetic waves in the photoelectric element according to this invention, such a pair of electrodes are not essential but they may be disposed. When a pair of electrodes is disposed, the pair of electrodes can share a portion of the so-called antenna function of radiating the resultant electromagnetic waves. Further, another radiation antenna may be attached to the electrodes.

For the electrode in this invention, the material known so far can be used with no problem so long as it has conductivity and it preferably contains one of materials selected from the group of Au, Pt, Ag, Cu, Ta, Nb and Ti. Such materials may be used alone but an alloy made of two or more of materials or an alloy of one or more of materials and an other metal is preferred. Such materials have favorable conductivity, high workability and stability and have been used so far as electrodes for electronic devices. Further, in a case where no sufficient adhesion can be obtained between the electrode and the substrate when the electrode is formed on the surface of the substrate, a bonding layer may be disposed between the electrode and the substrate.

As shown in FIG. 1, when a pair of electrodes 6a and 6b are disposed on the surface of the substrate 12, the distance between both of them (inter-electrode distance) is preferably 1 nm or more and 100 um or less. When the inter-electrode distance is excessively large, it is not preferred since a carbon nano-tube of a length capable of bridging them is not available easily. On the other hand, when the inter-electrode distance is excessively short, both of the electrodes may sometimes be in a substantially conduction state, or fabrication of electrodes is extremely difficult, which is not preferred in view of the cost. The upper limit for the inter-electrode distance is preferably 10 $\mu$m or less and the lower limit for the inter-electrode distance is more preferably 10 nm or more and, further preferably, 50 nm or more.

In this invention, there is no particular restriction on the thickness of the electrode but it is appropriately within a range from 10 nm to 100 $\mu$m and, preferably, within a range from 50 nm to 1 $\mu$m.

In this invention, it is not always necessary that the electrode is formed distinctly as an electrode as shown in FIG. 1. For example, printed wirings in a printed substrate may be used as one or both of the electrodes, to which the carbon nano-tube may be connected. In addition, the carbon nano-tube may be connected with any members such as lead wires or frame, which may be regarded as the electrode.

Both ends or the periphery of the carbon nano-tube are connected respectively to the pair of electrodes.

"Both ends or periphery thereof of the carbon nano-tube" means any portion from both ends to an intermediate position in the longitudinal direction of the carbon nano-tube and "are connected" thereof means that it may suffice that they are connected even partially at any of the portions, that is, it is not necessary that such portions are entirely connected. Further, "connection" referred to herein means electrical connection but it is not always necessary to be connected physically.

There is no particular restriction on the range for the position "intermediate position in the longitudinal direction"

and most of the portions in the longitudinal direction of the carbon nano-tube may be connected to one of the electrodes (that is, "intermediate" position is nearer from the other end than from the end on the side of the connection), so long as a pair of electrodes may be entirely bridged by the carbon nano-tube.

The connection resistance value between the carbon nano-tube and the electrode connected thereto is preferably 10 MΩ or less and, more preferably, 1 MΩ or less. When the connection resistance value is excessively high, it is not preferred since conductivity is insufficient. Since smaller connection resistance value is more preferred, no preferred lower limit is present. In a case of the carbon nano-tube and the electrode, it is generally limited to about 10 KΩ.

An angle formed between the carbon nano-tube and the electrode connected thereto is preferably 10° or more preferably, 30° or more and, further preferably, 45° or more and it is the most preferably the vertical. When the angle made between them is closer to vertical, it forms a state of bridging the carbon nano-tube at the shortest distance between the two electrodes in a case of disposing the carbon nano-tube between the two electrodes, which is preferred in that the length of the carbon nano-tube can be shortened.

"Angle formed between" means an angle formed between the carbon nano-tube and the electrode at a portion where the carbon nano-tube and the electrode are connected.

Referring to the angle made between them while assuming that the carbon nano-tube is linear and the electrode is rectangular, in a case where one end of the carbon nano-tube is abutted from the end to the intermediate position in the longitudinal direction linearly against the plane of the electrode and protrudes from the end edge of the electrode, it means a minimum angle formed between the edge end of the electrode and the carbon nano-tube.

In a case where the carbon nano-tube is curved, or in a case of using a non-linear material such as a carbon nano-bead, when it is difficult to determine an angle as a distinct relation between straight lines to each other, the angle formed between them may be determined by optionally drawing a tangential line at the boundary between the abutting portion and the non-abutting portion of the carbon nano-tube and the electrode.

For the connection between the carbon nano-tube and the electrode, in a case where both of them are in a linear abutment as shown in FIG. 1, bonding can be expected to some extent with no particular fixation. When more strong connection is intended or in a case where the abutting portion between both of them is short, it is desirable to fix both of them. There is no particular restriction on the actual fixing method and the method can include, for example, application of electron beams to a portion aimed for fixation, thereby depositing amorphous carbon to the irradiated portion to fix the electrode and the carbon nano-tube. Further, the method can also include fixation of the carbon nano-tube and the electrode simultaneously with production of the carbon nano-tube by a method such as growing of the carbon nanotube directly on the electrode used as a catalyst, or fixing a catalyst metal to the electrode, on which a carbon nano-tube is grown in production of the carbon nanotube.

<Substrate>

In this invention, there is no particular restriction on the substrate to which electrodes are formed optionally. In a case where high speed optical pulse signals as a target for conversion are applied on the side of the substrate, it is required that the material of the substrate can transmit the light at the wavelength of the high speed optical pulse signals. Further, it is required that at least the surface of the substrate on the side where the carbon nano-tube is disposed is insulative. Any of electronic substrates known so far can be used within a range capable of satisfying such conditions.

The actual resistivity on the surface of the substrate disposed with the carbon nano-tube is preferably $1 \times 10^6$ Ω·cm or more and, more preferably, $5 \times 10^6$ Ω·cm or more. When the resistivity of the surface is less than $1 \times 10^6$ Ω·cm, it substantially approaches conductivity and insulation between the electrodes 6a, 6b can no more be ensured for example in a case of FIG. 1, which is not preferred. On the other hand, there is no restriction for the upper limit of the resistivity on the surface, it is generally about $1 \times 10^{12}$ Ω·cm.

Further, in a case where the signal light is incident on the side of the substrate, since delay may sometimes be formed by the dispersion of light to loose the shape of pulse signals, the substrate is preferably formed with the dispersion elimination layer.

A preferred constitution of a substrate is to be explained with reference to the example of the photoelectric conversion element having the constitution shown in FIG. 1 and FIG. 2. As shown in FIG. 1 and FIG. 2, the substrate 12 is formed with the dispersion elimination layer 8 at least at a portion where the carbon nano-tube 2 is disposed.

In a case where the carbon nano-tube 2 is bridged over the electrodes 6a and 6b as shown in FIG. 1, "portion where the carbon nano-tube 2 is disposed" means a portion in which the carbon nano-tube 2, not the electrodes 6a and 6b, is situated above on the surface of the substrate 12 irrespective of the presence or a absence of contact (relatively above with reference to the surface of the substrate 12 irrespective of the gravity of the Earth here and hereinafter). Also in a case of not having electrodes as shown in FIG. 2, it means a portion on the surface of the substrate 12 where the carbon nano-tube 2 is situated above irrespective of presence or absence of contact. In the foregoing definition, presence of the fine semiconductor particles 4 is not taken into a consideration.

While an S-doped InP substrate is used for the support plate 10 in this embodiment, it is not restricted only thereto. The thickness of the support plate may properly be adjusted depending on the material to be used so as to ensure a sufficient shape retainability and, usually, it is properly selected within the same range as for the general electric wiring substrates.

While InP (undoped) is used in this embodiment as the material for the dispersion elimination layer 8, it is not restricted only thereto. Any material may be used for the dispersion elimination layer 8 so long as the material has a function of eliminating dispersion of the light and a material capable of easily ensuring the dose contact with the substrate layer 10 is preferred. As the material having a function of removing the dispersion of light, a semiconductor super lattice layer can be exemplified as a preferred material.

As the materials forming the semiconductor super lattice layer, those including two or more of elements selected from the group of Ga, As, In and P are preferred and InP as in this embodiment is particularly preferred. The materials are used in an undoped state.

When the dispersion elimination layer 8 is formed at the uppermost surface of the substrate 12 as described above, the substrate 12 can be provided with electric insulation irrespective of absence or presence of conductivity in the support plate 10.

The thickness of the dispersion elimination is preferably equal to or larger than 100 nm and equal to or smaller than 10 μm and, more preferably, equal to or larger than 500 nm and equal to or smaller than 2 μm. When the dispersion elimination layer is excessively thin, the dispersion eliminating effect is reduced and, on the other hand, when it is excessively thick, scattering or absorption of light increases, which is not preferred respectively.

<Protective Layer>

Figure 3:
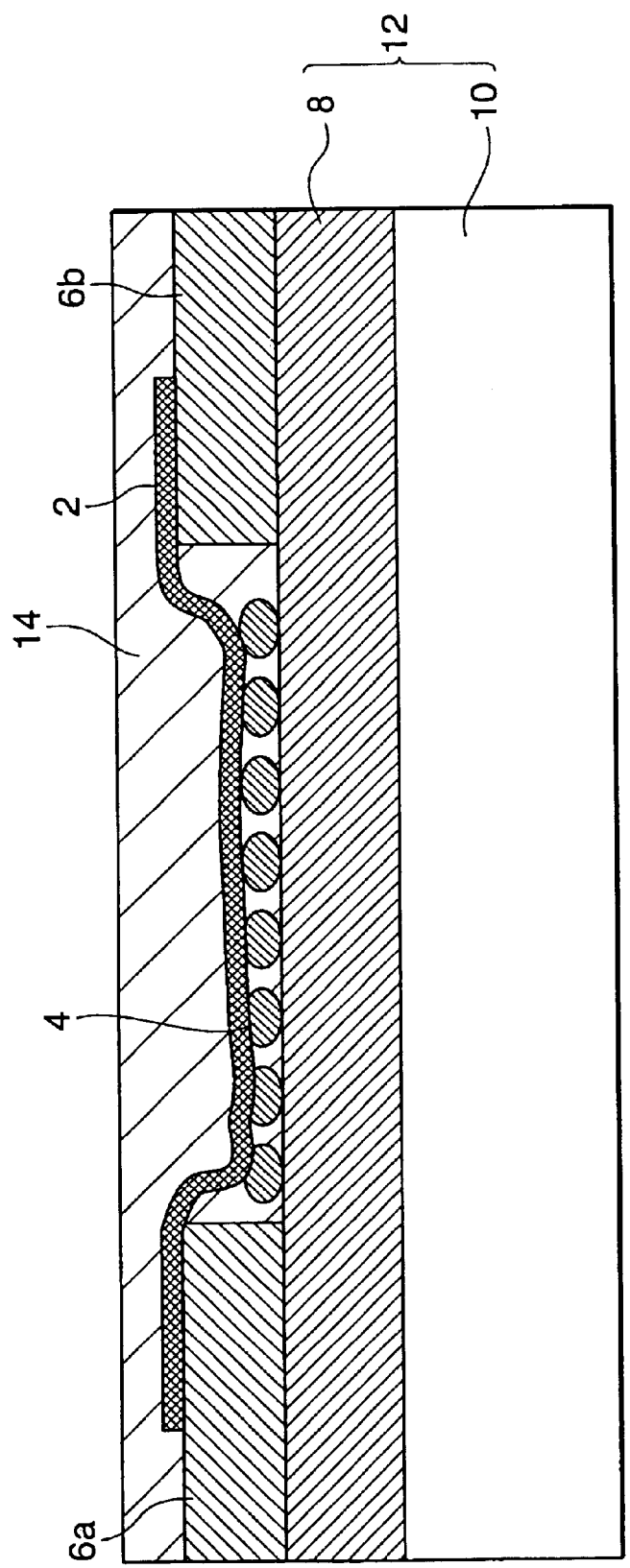
FIG. 3 is a cross sectional view showing a state in which a protective layer is formed to the photo-electronic conversion element shown in FIG. 1.
Figure 4:
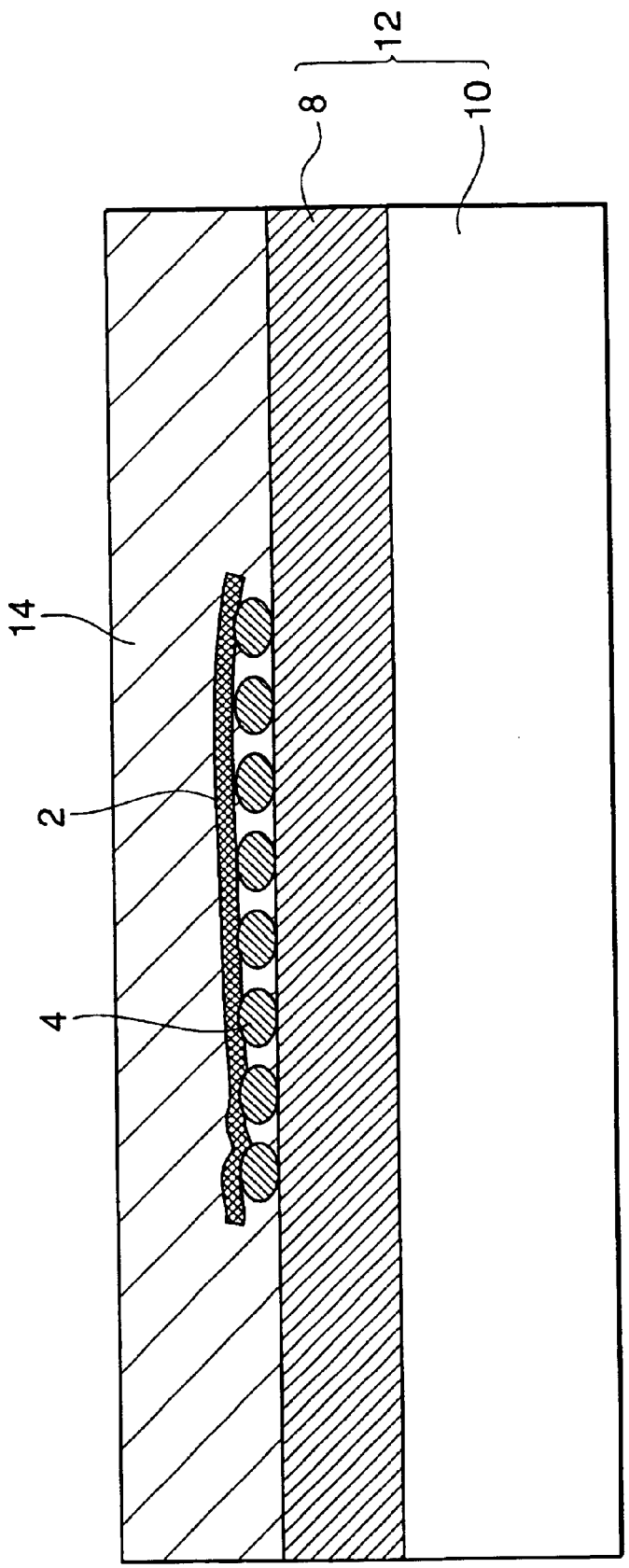
FIG. 4 is a cross sectional view showing a state in which a protective layer is formed to the photo-electronic conversion element shown in FIG. 2.

It is preferred that at least a portion of the carbon nano-tube is covered with a protective layer. FIG. 3 is a cross sectional view showing a state where a protective layer is formed to a photoelectric conversion element according to this invention shown in FIG. 1. In FIG. 3, a protective layer 14 is formed so as to cover the carbon nano-tube 2 entirely and extend as far as the surface of electrodes 6a and 6b. Further, FIG. 4 is a cross sectional view showing a state where a protective layer is formed on the photoelectric conversion element according to this invention shown in FIG. 2. Also in FIG. 4, a protective layer 14 is formed so as to cover the carbon nano-tube 2 entirely.

The protective layer 14 preferably includes a dielectric material. The dielectric material preferred for the protective layer can include, in view of the external air shielding function or mechanical protective function, for example, inorganic materials such as silicon oxide, silicon nitride, silicon oxinitride, titanium oxide, niobium oxide, lithium niobate, strontium titanate and diamond, as well as various kinds of resins such as polyethylene, polypropylene, polyvinyl chloride, polyvinylidene chloride, acrylic resin, polycarbonate resin, fluoro resin, amide resin, polyethylene terephthalate, polyurethane and polystyrene.

The protective layer is formed preferably so as to cover the carbon nano-tube 2 entirely as the protective layer 14 shown in FIG. 3 and FIG. 4 but it suffices that at least a portion of the carbon nano-tube is covered. So long as a portion is covered, shielding for external air or mechanical protection can be expected for the covered portion. Referring to the shielding of the external air, it is not required for complete sealing but complete sealing is naturally preferred.

The thickness of the protective layer varies depending on the selection of the material for the layer and cannot be defined generally but it is usually preferred within a range from 100 nm to 0.1 nm.

<Manufacture of Photoelectric Conversion Element of this Invention>

There is no particular restriction on the method of manufacturing the photoelectric conversion device according to this invention described above. Actual examples of disposing a carbon nano-tube, as well as a pair of electrodes and fine semiconductor particles on the surface of a substrate formed with a dispersion elimination layer are set forth below but this invention is not restricted only to them.

As a method of forming the dispersion elimination layer on the surface of an appropriate support plate, a semiconductor super lattice layer can be formed by epitaxially growing by adopting an organic vapor phase method or a halogeno-chemical vapor phase growing method.

As a method of forming electrodes on the surface of a substrate, a mask vapor deposition method is convenient. When it is intended to form them more precisely, particularly, when it is intended to make the distance between both of the electrodes more narrow in a case of forming a pair of electrodes, it is desirably formed by electron beam lithography.

For forming the layer of fine semiconductor particles on one electrode or between a pair of electrodes formed, various kinds of vapor deposition methods can be mentioned. Specifically, a molecular beam vapor deposition method is preferred in view of the control for the grain size of the fine particles and the film thickness of the fine particle layer.

For disposing a carbon nano-tube which is caused to function as a light sensor on one electrode or between a pair of electrodes formed, the method therefor can include, for example, a method of arranging carbon nano-tubes directly by use of a manipulator while observing by a microscope such as a scanning electron microscope (SEM), or a method of dispersing carbon nano-tubes into an appropriate dispersion medium and dripping the liquid dispersion between a pair of electrodes and drying the same. Particularly, when it is intended to highly orient the carbon nano-tube between a pair of electrodes, there can be mentioned a method of dripping the liquid dispersion between the pair of electrodes and then arranging them by applying electric fields between the pair of the electrodes. The method of arrangement is to be explained with reference to FIG. 5.

Figure 5C:
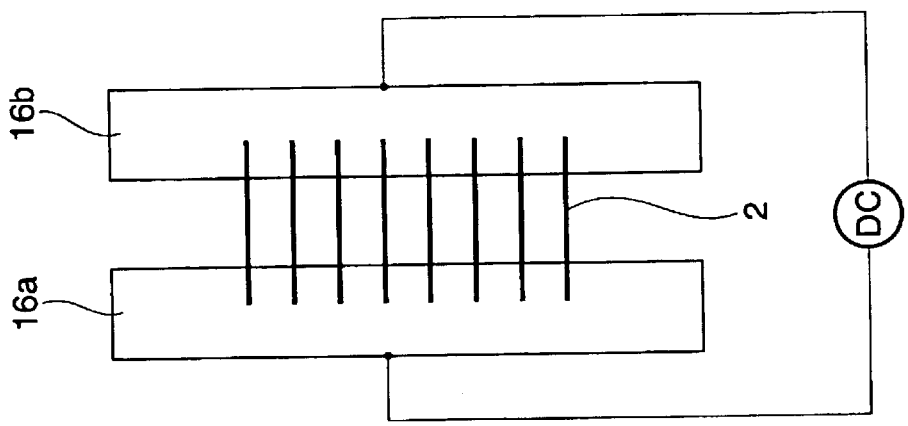
FIGS. 5A to 5C are schematic plan views for explaining a method of applying electric fields between a pair of electrodes to arrange carbon nano-tubes.
Figure 5B:
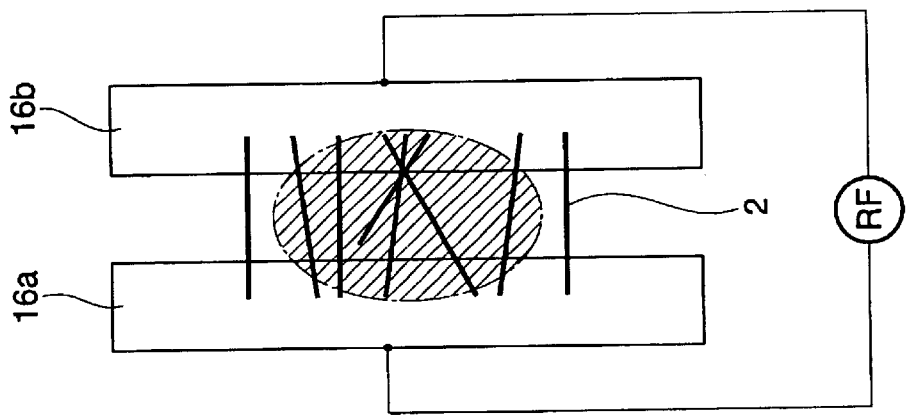
Figure 5A:
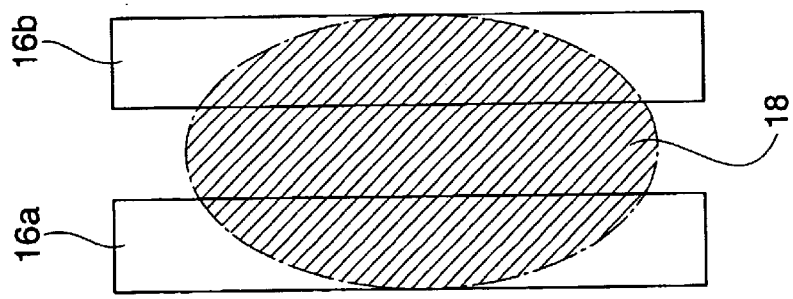

FIGS. 5A to 5C are schematic plan views for explaining the method of arranging the carbon nano-tubes by applying electric fields between a pair of electrodes, which is shown in accordance with time sequence in the order of 5A to 5C. At first, carbon nano-tubes are dispersed into an appropriate dispersion medium to prepare a liquid dispersion. There is no particular restriction on the usable dispersion medium and, for example, isopropyl alcohol or dimethyl formamide can be mentioned as preferred examples. The obtained liquid dispersion is dripped between electrodes 16a and 16b as shown in FIG. 5A into a state of bridging the liquid dispersion 18 between both of the electrodes.

Then, as shown in FIG. 5B, the dispersion medium in the liquid dispersion 18 is evaporated while applying high frequency waves by a high frequency wave device RF between the electrodes 16a and 16b to arrange the carbon nano-tubes 2 between the electrodes 16a and 16b. Then, as shown in FIG. 5C, the carbon nano-tubes are arranged in a direction perpendicular to the electrodes 16 and 16b. The wavelength of the high frequency waves applied in this case is about 50 MHz.

Further, as shown in FIG. 5C, a DC voltage at about 2 to 5 V is applied between the electrodes 16a and 16b by a DC power source device DC to burn out component materials in the carbon nano-tube 2, leaving only semiconductive components.

As described above, the carbon nano-tubes can be arranged between the electrodes 16a and 16b. Details for the method are described in "Engineering Carbon Nanotubes and Nanotube Circuits Using Electrical Breakdown" Science, vol. 292, p. 706 to 709 (2001) and the method is applicable as it is.

<Application Use of Photoelectric Conversion of this Invention>

The photoelectric conversion element according to this invention as has been described above can be used as an element for converting high speed optical pulses directly into high frequency waves or electromagnetic waves in optical signal processing, optical communication, high frequency wave signal processing or high frequency wave signal communication. Accordingly, high speed optical pulse signals, for example, obtained from optical fibers can be utilized, after being optionally amplified, directly from the photoelectric conversion element according to this invention by detecting high frequency waves or electromagnetic waves in various types of detection devices.

In this invention, the frequency of the high speed optical pulses to be converted is within a range from 1 MHz or more and 10 THz or less and, particularly, those at 100 MHz or more and 1 THz or less can be suitably converted photoelectrically.

Further, in this invention, the wavelength of the high speed optical pulses to be converted is within a range from 1 μm or more and 2 μm or less and, particularly, those at a wavelength within a range from 0.4 μm or more and 1.8 μm or less can be converted preferably photoelectrically.

The photoelectric conversion element according to this invention can be constituted as a photoelectric conversion device according to this invention by applying the same to a photoelectric conversion device having a high frequency detector that converts high frequency waves converted by the element into electric signals. There is no particular restriction on the high frequency detector usable herein so long as it can detect the high frequency waves after photoelectric conversion, for which those detectors known so far can be used.

EXAMPLE

This invention is to be explained more specifically with reference to examples. However, this invention is not restricted by the examples to be described below.

Example 1

In this example, the same photoelectric element having the same structure as shown in FIG. 1 was fabricated except that plural carbon nano-tubes were used.

At first, an S-doped n-type InP substrate ((100 face) sized 20 mm×20 mm and with 500 μm in thickness was sputter etched to about 30 nm by an argon beam sputtering method. Subsequently, chemical etching was applied with a solution including $H_2SO_4:H_2O:H_2O_2=3:1:1$ (mass ratio) for about 80 seconds (kept at a temperature of 25° C.), the substrate was washed with super purified water, and dried with isopropyl alcohol to form a support plate 10. Then, an undoped InP layer (about 1 μm in thickness) was epitaxially grown by a halogeno chemical vapor deposition method to epitaxially grow an undoped InP layer (about 1 μm in thickness) to form a dispersion elimination layer 8. A parallel electrode pattern (sized 500 μm×200 μm) was formed on the dispersion elimination layer 8 by photo-resist and mask aligner exposure device, Au was deposited to a thickness of 100 nm by an electron beam vapor deposition method to form electrodes 6a and 6b. The inter-electrode distance between the electrodes 6a and 6b was 3 μm. Further, a layer (100 nm in thickness) including fine InAs particles (fine semiconductor particles 4) of about 20 nm in diameter was formed between the electrodes 6a and 6b by a molecular beam vapor deposition method.

Figure 6:
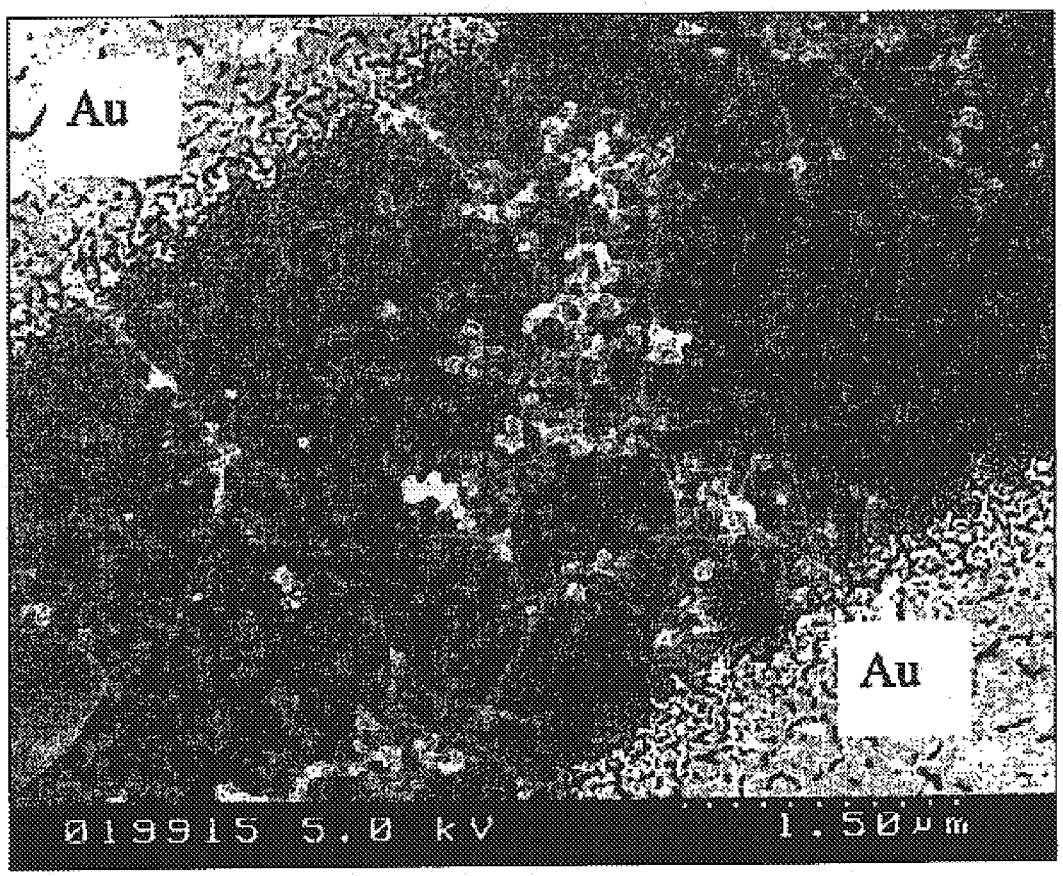
FIG. 6 is an SEM photographic image (magnification ratio: about 30,000×) of a photoelectric conversion element in Example 1.

Then, plural single wall carbon nano-tubes each of an average diameter of about 3 nm fabricated by an arc discharging method was connected in a state bridging between electrodes 6a and 6b. In this case, for obtaining high orientation, carbon nano-tubes were dispersed in an aqueous solution of isopropyl alcohol (isopropyl alcohol:water=10:1 (mass ratio)) at a concentration of 10 mg/l to prepare a liquid dispersion, and the liquid dispersion was dripped by one drop between the electrodes 6a and 6b, and a high frequency at 50 MHz (peak-to-peak voltage 150 V) was applied. FIG. 6 shows a scanning electron microscopic (SEM) images (magnification factor: about 30,000×) in a state where the carbon nano-tubes were connected to electrodes.

A photoelectric conversion element of this embodiment was obtained as described above.

Figure 7:
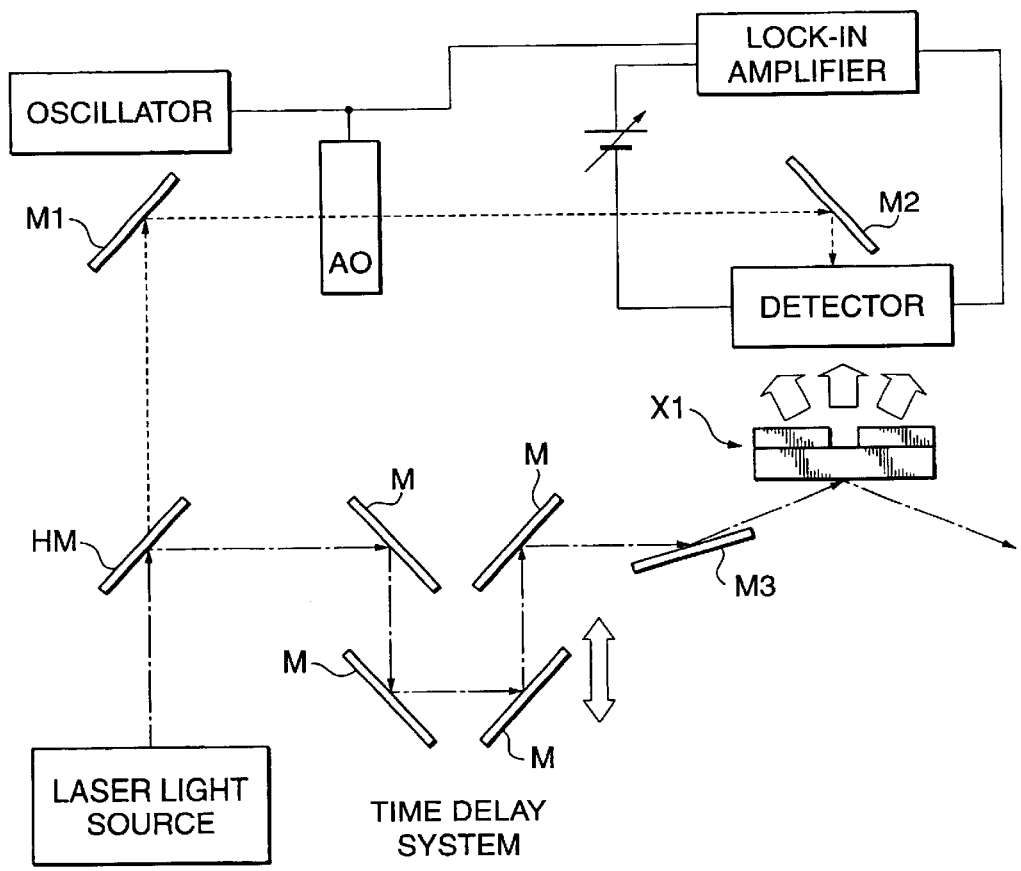
FIG. 7 is a schematic constitutional view showing the outline of an optical system and a measuring system for measuring photoelectric conversion characteristics of the photoelectric conversion element in Example 1.

The thus obtained photoelectric conversion element of this example was incorporated in an optical system and a measuring system shown in FIG. 7 and photo-electronic conversion characteristics were measured. In FIG. 7 are shown a mirror M, a half-mirror HM, an acousto-optic modulator AO and a photoelectric conversion element X1 of this example. A super high speed pulse light emitted from a laser optical source is adjusted for the pulse width by a time delay system and then applied to the photoelectric conversion element X1 on the side of the substrate at an angle causing substantially entire reflection. Further, a portion of the super high speed pulse light is transmitted through the half-mirror HM and then supplied by way of the acousto-optic modulator to the detector, by which the detection timing for the super high speed pulse light is adjusted.

A fiber laser (IMRA Inc. Femtolight, 30 mW power) was used for the laser optical source, and the super high speed pulse light emitted therefrom had a wavelength: $\lambda=1532$ nm and a pulse width of 0.55 ps.

Figure 8:
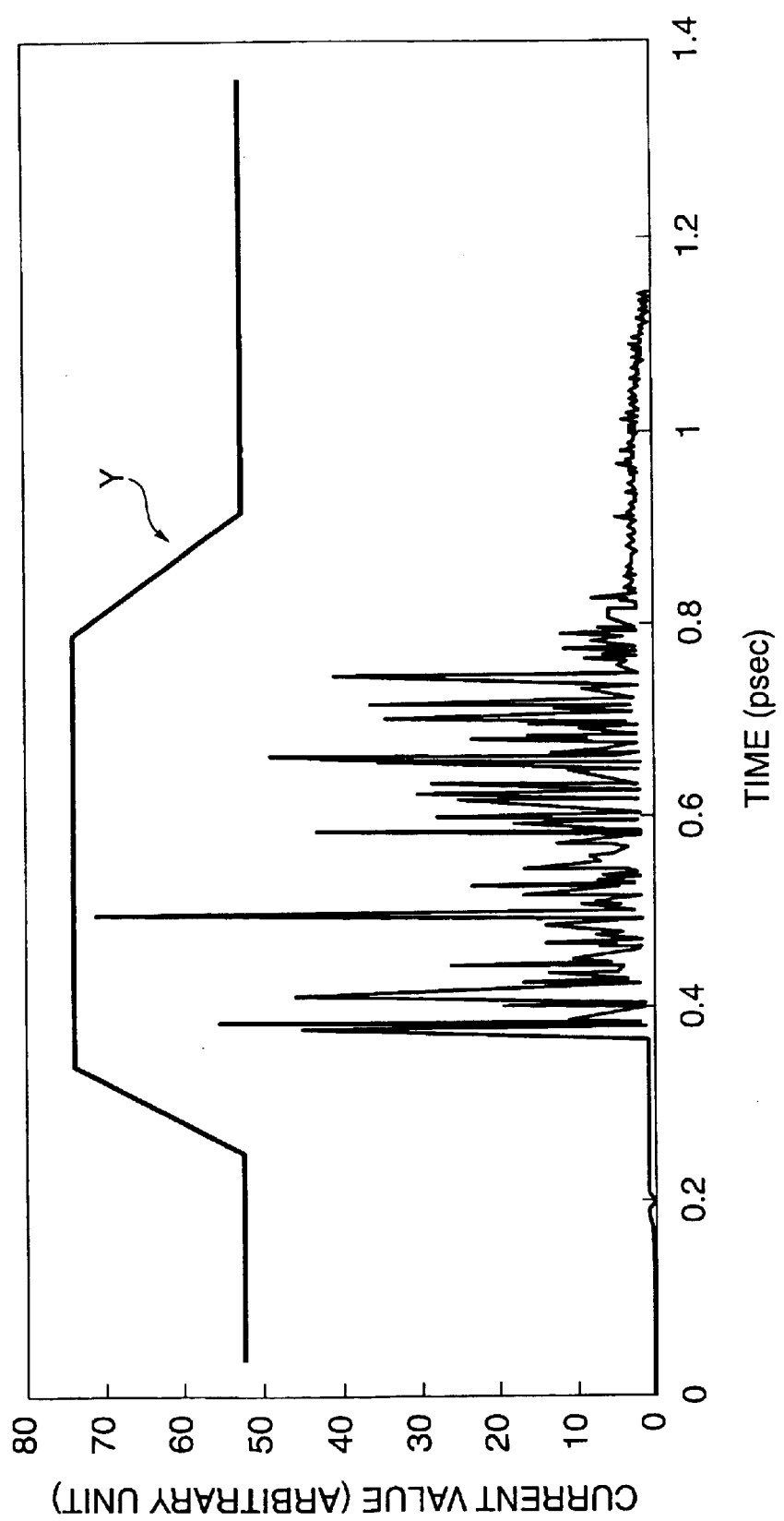
FIG. 8 is a graph showing the result of measurement for photoelectric conversion characteristics for the photoelectric conversion element in Example 1 in which the abscissa represents the time and the ordinate represents the current value (arbitrary unit) measured by the measuring system, respectively.

Then, the generated electromagnetic waves were detected by the detector. FIG. 8 shows a relation between the current value (event signal) measured by a lock-in amplifier and the time. In the graph of FIG. 8, the abscissa represents the time and the ordinate represents the current value measured by the measuring system (at arbitrary unit), respectively. In the graph of FIG. 8, a polygonal line Y schematically shows the pulse of applied super high speed pulse light, which has no correlation with the current value on the ordinate.

It can be seen from the graph in FIG. 8 that the events of high frequency wave signals in accordance with the optical pulse are detected and the optical pulse signals in the order of sub-pico seconds are converted at a good SN ratio.

Example 2

In this example, a photoelectric conversion element of the same structure as shown in Example 1, excepting that the material for each of component was different, was fabricated. However, the layer formed on the support plate (quartz substrate) is not a dispersion elimination layer but a silicon nitride layer as a dielectric layer. Further, since adhesion was not sufficient when a gold electrode was intended to be formed directly on the surface of the silicon nitride layer, a Ti layer was put between them as a bonding layer.

At first, a silicon nitride layer (200 nm in thickness) was grown on one surface of a quartz substrate sized 10 mm×10 mm and with 500 μm in thickness by a plasma chemical vapor phase deposition method, to form an uppermost surface layer. Then, a pair of Au electrodes having a Ti layer as an a bonding layer (Ti/Au electrode, Ti layer: 100 nm thickness, gold layer: 300 nm thickness) were formed. A pair of Ti/Au electrodes were formed by an electron beam vapor deposition method in the same manner as in Example 1. Each of the electrodes had a size of 500 μm×200 μm, and the inter-electrode distance was 3 μm. Further, a layer (100 nm thickness) including fine InAs particles of about 20 nm diameter (fine semiconductor particles 4) was formed between the pair of the electrodes in the same manner as in Example 1. Then, plural single wall carbon nano-tubes were connected in a state being bridged between the pair of electrodes.

The photoelectric conversion element in this example was obtained as described above.

Figure 9:
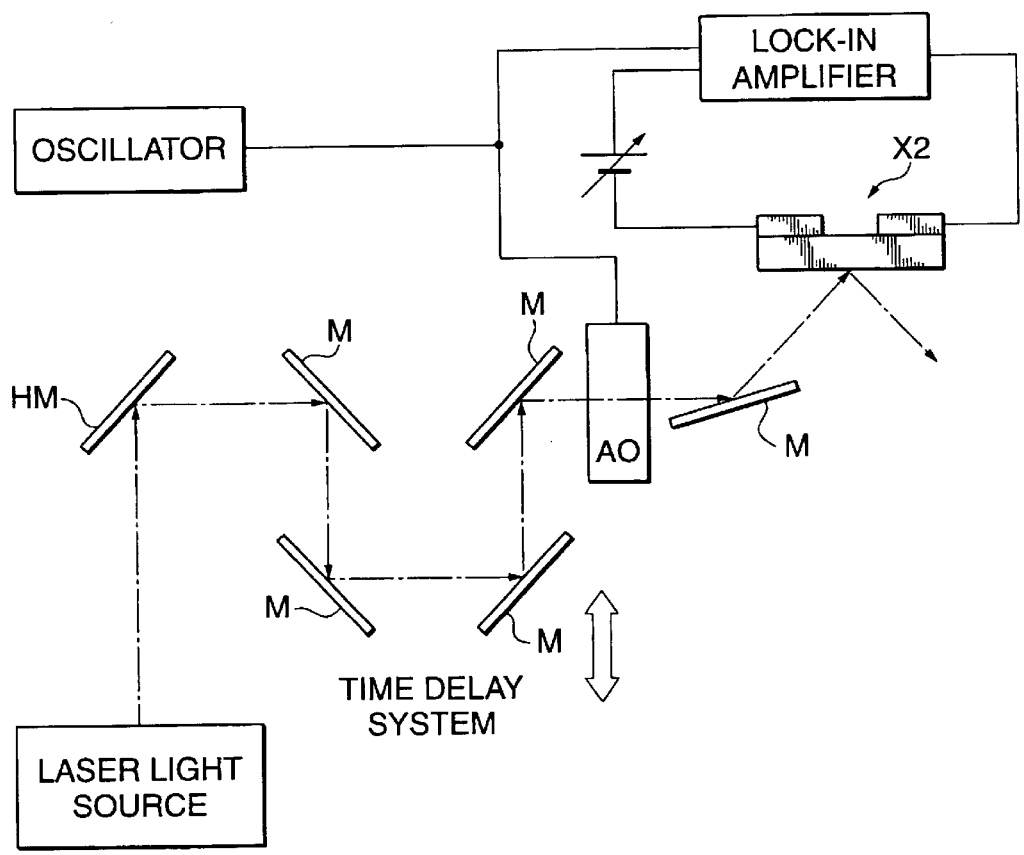
FIG. 9 is a schematic constitutional view showing the outline of an optical system and a measuring system for measuring photoelectric conversion characteristics of the photoelectric conversion element in Example 2.

The thus obtained photoelectric conversion element of this example was incorporated in an optical system and a measuring system shown in FIG. 9, and the photoelectric conversion characteristics were measured. Each of references in FIG. 9 is identical with that in FIG. 7 and X2 shows a photoelectric conversion element in this example. A super high speed pulse light emitted from a laser light source is adjusted for the pulse width by a time delay system and then passed through an acousto-optic modulator and then applied from the photoelectric conversion element X2 on the side of the substrate at an angle causing substantially entire reflection. The detection timing for the super high speed pulse light is adapted to be controlled by passing the acousto-optic modulator.

A fiber laser (IMRA Inc., Femtolight, 30 mW power) was used for the laser light source and the super high speed pulse light generated therefrom had a wavelength λ=1532 nm and the pulse width of 0.55 ps.

Figure 10:
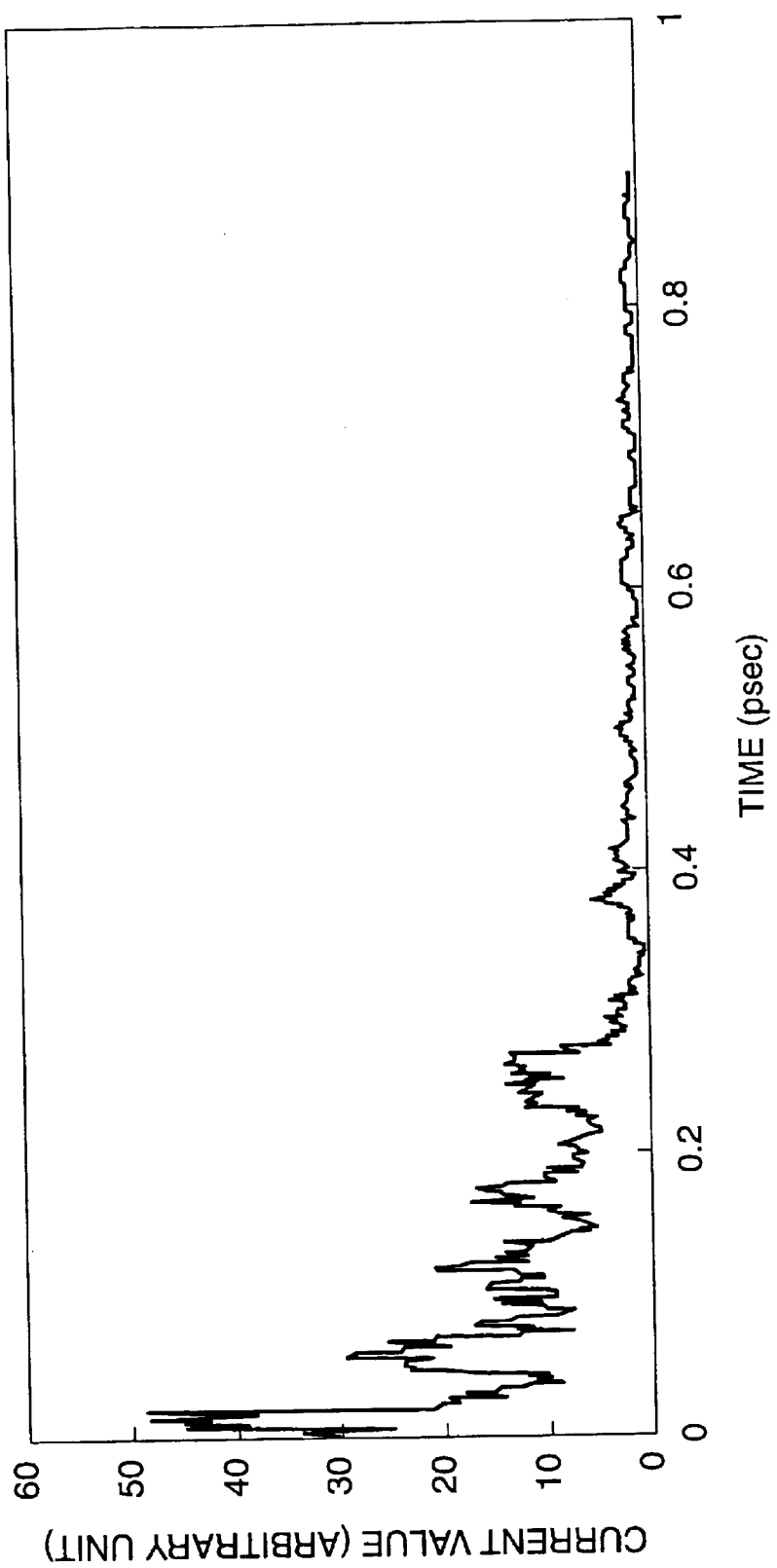
FIG. 10 is a graph showing the result of measurement for photoelectric conversion characteristics for the photoelectric conversion element in Example 2 in which the abscissa represents the time and the ordinate represents the current value (arbitrary unit) measured by the measuring system, respectively.

The generated electromagnetic waves were detected by a detector, and FIG. 10 shows a graph illustrating a relation between the current value measured by a lock-in amplifier (event signal) and the time. In the graph of FIG. 10, the abscissa represents the time and the ordinate represents the current value measured by the measuring system (arbitrary unit), respectively.

It can be seen from the graph of FIG. 10 that events of the high frequency wave signals in accordance with the optical pulses are detected, and the optical pulse signals in the order of sub-pico second are converted into high frequency signals at a good SN ratio.

Comparative Example 1

In this comparative example, a photoelectric conversion element of the same structure as shown in Example 1 was fabricated except for not disposing the carbon nano-tube but using only fine InAs particles as a light sensor. That is, a pair of Au electrodes were deposited to a thickness of 100 nm on an Sdoped n-type InP substrate ((100) face), on which an undoped InP layer (about 1 μm thickness) was epitaxially grown in the same manner as in Example 1 and, further, a fine InAs particles (about 20 nm diameter) layer was formed between the pair of Au electrodes by a molecular beam vapor deposition method to obtain a photoelectric conversion element in this comparative example.

The thus obtained photoelectric conversion element of this comparative example was assembled into the same optical system and the measuring system as those in Example 1, and the photoelectric conversion characteristics were measured. Wavelength λ was set to 1560 nm, and a radiation antenna was attached between the Au electrodes of the photoelectric conversion element and the emitted electromagnetic waves were measure by a parabola antenna of 50 cm in diameter. FIG. 11 is a graph illustrating a relation between the measured current value (event signal) and the time. In the graph of FIG. 11, the abscissa represents the time and the ordinate represents the current value measured in the measuring system (arbitrary unit), respectively.

It can be seen from the graph of FIG. 1 that events of the high frequency wave signals in accordance with the optical pulses were detected and the optical pulse signals in the order of the sub-pico second were converted into the high frequency signals but the SN ratio of the signals was poor.

Example 3

In this example, a photoelectric conversion element of the same structure as in Example 2 was fabricated except for not forming a fine InAs particle layer between the electrodes but using only the carbon nano-tubes as the light sensor. In the same manner as in Example 2, a silicon nitride layer (200 nm in thickness) was grown on a quartz substrate by a plasma chemical vapor phase deposition method, a Ti/Au electrode was formed by an electron beam vapor deposition method and, further, plural single wall carbon nano-tubes each of about 3 nm in diameter fabricated by an arc discharging method were connected between the electrodes in a state of bridging the pair of electrodes.

The photoelectric conversion element of this example was obtained as described above.

The thus obtained photoelectric conversion element of this example was incorporated in the same optical system and the measuring system as those in Example 1, and the photoelectric conversion characteristics were measured. A radiation antenna was attached between the Au electrodes of the photoelectric conversion element and the emitted electromagnetic waves were measured by a parabola antenna of 50 cm in diameter. FIG. 12 is a graph illustrating a relation between the measured current value (event signal) and the time. In the graph of FIG. 12, the abscissa represents the time and the ordinate represents the current value measured in the measuring system (arbitrary unit), respectively.

It can be seen from the graph of FIG. 12 that, although events of high frequency signals in accordance with the optical pulses are detected and the optical pulse signals in the order of the sub-pico seconds are converted into the high frequency signals, the SN ratio of the signals is poor compared with that of the photoelectric conversion element of Example 1 or 2 and better compared with that of Comparative Example 1.

As has been described above, this invention can provide a photoelectric conversion element and a photoelectric conversion device capable of directly converting high speed optical pulse signals in a communication band into signals of high frequency waves or electromagnetic waves at a good SN ratio.

What is claimed is:

1. A photoelectric conversion element to receive high speed optical pulse signals and convert them into high frequency waves, the photoelectric conversion element comprising:
    a substrate; and
    a light sensor disposed on the substrate, wherein the light sensor includes at least a carbon nano-tube.
2. A photoelectric conversion element according to claim 1 comprising:
    a pair of electrodes connected to both ends or the periphery of the carbon nano-tube.
3. A photoelectric conversion element according to claim 1, wherein the light sensor comprises:
    fine semiconductor particles in electric contact with the carbon nano-tube.
4. A photoelectric conversion element according to claim 2, wherein the light sensor comprises;
    fine semiconductor particles disposed on the substrate between the pair of electrodes, the fine semiconductor particles being in electrical contact with the carbon nano-tube.
5. A photoelectric conversion element according to claim 3, wherein the fine semiconductor particles include a kind of fine semiconductor particles selected from a group of InAs, GaAs, InP, InSb, GaN, InN and GaInN.
6. A photoelectric conversion element according to claim 1, wherein plural carbon nano-tubes are disposed.
7. A photoelectric conversion element according to claim 1, wherein the carbon nano-tube is a multi-wall carbon nano-tube.
8. A photoelectric conversion element according to claim 1, wherein a diameter of the carbon nano-tube is equal to or larger than 0.3 nm and equal to or smaller than 100 nm.
9. A photoelectric conversion element according to claim 1, wherein the length of the carbon nano-tube is equal to or longer than 0.1 nm and equal to or shorter than 100 nm.

10. A photoelectric conversion element according to claim 2, wherein each of the pair of electrodes includes one of materials selected from a group of Au, Pt, Ag, Cu, Ta, Nb and Ti.

11. A photoelectric conversion element according to claim 2, wherein a gap between the pair of electrodes has a length equal to or longer than 1 nm and equal to or shorter than 100 µm.

12. A photoelectric conversion element according to claim 2, wherein a connection resistance value between the carbon nano-tube and an electrode connected thereto is 10 MΩ or less.

13. A photoelectric conversion element according to claim 1, wherein a dispersion elimination layer is formed at least on a portion of the substrate where the carbon nano-tube is disposed.

14. A photoelectric conversion element according to claim 13, wherein the dispersion elimination layer comprises a semiconductor super lattice layer.

15. A photoelectric conversion element according to claim 14, wherein the semiconductor super lattice layer comprises two or more elements selected from a group of Ga, As, In and P.

16. A photoelectric conversion element according to claim 1, wherein at least a portion of the carbon nano-tube is covered with a protective layer.

17. A photoelectric conversion element according to claim 16, wherein the protective layer is made of a dielectric body.

18. A photoelectric conversion element according to claim 1, wherein a frequency of the high speed optical pulse signals to be converted is equal to or higher than 1 MHz and equal to or lower than 10 THz.

19. A photoelectric conversion element according to claim 1, wherein the wavelength of the high speed optical pulse signals to be converted is equal to or longer than 1 µm and equal to or shorter than 2 µm.

20. A photoelectric conversion device comprising a photoelectric conversion element according to claim 1 and a high frequency wave detector for converting high frequency waves converted by the photoelectric conversion element into electric signals.

* * * * *